US005993636A

United States Patent [19]

Terui et al.

[11] Patent Number: 5,993,636

[45] Date of Patent: Nov. 30, 1999

[54] METHOD OF MAKING A NEEDLE ELECTRODE

[75] Inventors: Yoshinori Terui; Katsuyoshi Tsunoda, both of Shibukawa, Japan

[73] Assignee: Denki Kagaku Kogyo Kabushiki Kaisha, Tokyo, Japan

[21] Appl. No.: 08/873,083

[22] Filed: Jun. 11, 1997

[30] Foreign Application Priority Data

Jun. 12, 1996 [JP] Japan .................................... 8-151137

[51] Int. Cl.[6] .............................. B23H 11/00; C25F 3/00; H01L 7/00; H05K 3/07

[52] U.S. Cl. .......................... 205/640; 205/660; 205/644; 205/645; 29/592.1

[58] Field of Search ..................................... 205/660, 661, 205/250, 651, 654, 645, 674, 644, 640; 204/280, 290 R, 290 F; 83/950; 29/592.1

[56] References Cited

U.S. PATENT DOCUMENTS

| | | | |
|---|---|---|---|
| 761,675 | 6/1904 | Hartwig | 337/231 |
| 3,607,678 | 9/1971 | Wise | 204/15 |
| 4,219,793 | 8/1980 | Kawamura | 337/228 |
| 4,379,250 | 4/1983 | Hosoki et al. . | |
| 5,286,355 | 2/1994 | Fainchtein et al. | 204/129.55 |
| 5,306,274 | 4/1994 | Long | 606/28 |
| 5,630,932 | 5/1997 | Lindsay et al. | 204/645 |

FOREIGN PATENT DOCUMENTS

| | | |
|---|---|---|
| 6-12972 | 6/1994 | Japan . |
| 1 028 351 | 5/1966 | United Kingdom . |

OTHER PUBLICATIONS

Muller Erwin W. et al.: "Field Ion Microscopy, principles and applications" 1969, American Elsevier Publisher Comp., Inc., New York XP002101567 Standard Book No.: 444–0062–3; Library of Congress card No.: 69–11267—p. 119–p. 127, No Month Available.

*Primary Examiner*—Kathryn Gorgos
*Assistant Examiner*—Wesley A. Nicolas
*Attorney, Agent, or Firm*—Oblon, Spivak, McClelland, Maier & Neustadt, P.C.

[57] ABSTRACT

A method of making a needle electrode is such that a neck portion is formed in a thin wire made of a tungsten single crystal and the thin wire is cut at the neck portion by feeding an electric current in electrolyte.

11 Claims, 4 Drawing Sheets

METHOD OF MAKING A NEEDLE ELECTRODE

BACKGROUND OF THE INVENTION

The present invention relates to a method of making a needle electrode applicable to an electron emitter used for an electron microscope, a CD (critical dimensions) SEM, an electron beam lithography system, an IC tester or the like and an ion source used for a focused ion beam (FIB) source such as a mask repair, an ion implantation device, a device for analyzing a cross-section of a semiconductor device, a specimen preparation apparatus for a transmission electron microscope or the like.

There is a demand for electron emitters of higher brightness in order to increase spatial resolution and efficiency on an electron beam utilizing apparatus such as an electron microscope, and various types of electron emitter such as a thermoionic emitter, e.g., a point filament, or a Schottky emitter have been studied.

For instance, a cold field emitter as a source of emitting electrons having a high brightness wherein a thin wire made of a tungsten single crystal is cut off by electropolishing to form a sharp edge used for an electron emitting surface, is widely used as an electron source for a high resolution electron microscope. Further, a ZrO/W TFE (thermal field emitter) wherein a ZrO layer is coated on the surface of a chip made of a tungsten single crystal so that the work function of (100) surface is reduced from about 4.5 eV to about 2.8 eV is noted in recent years.

Even in any electron emitter, as understood from the Fowler-Nordheim formula or the Schottky formula, the emission current density is determined based on the work function of the electron emitting area of the emitter and a distribution of the electric field strength. The distribution of the electric field strength depends strongly on a voltage applied across the emitter and the extraction electrode and the geometry of the emitting area located at the end of the emitter in particular, and it is an important factor controlling the characteristic of the electron emitter.

Regarding the geometry of the top end of an electron emitter, for instance, the before-mentioned ZrO/W TFE, there has been known that when the radius of curvature of the top end is increased to 1 $\mu$m or more, the energy spread of emitting electrons is decreased, and stability is improved (J. Vac. Sci. Technol., 16(6) 1979, 1704–1708, J. Applid Physics., 46, 5(1975) 2029–2050).

Further, Japanese Unexamined Patent Publication JP-A-7-105834 discloses a method that an electric discharge makes the curvature of the radius in TFE larger so that the energy spread becomes small and a stable emission is obtainable. It also discloses that in trying to heat the conventional TFE to about 2,800 K, it has been found that the half cone angle is large as 40° or more which is unsuitable for practical use. In addition, the publication suggests that a TFE having a large radius of curvature and having a shape of the top end in which the half cone angle is small can not be processed by the conventional electropolishing method.

In fact, in the conventional electropolishing method, the half cone angle becomes large as the radius of curvature is larger, and it was difficult to control the half cone angle to be 5° or less even when the radius of curvature was 0.6 $\mu$m or less, or to control the half cone angle to be 10° or less even when the radius of curvature was 0.6 $\mu$m–2.0 $\mu$m.

In Japanese Unexamined Patent Publication JP-A-8-36981, the inventors of this application propose that a TFE having a large radius of curvature of 1.2–10 $\mu$m and a full cone angle of 25° or less can provide in a stable manner electron beams having an energy spread of 0.5 eV or less and a angular current density of 0.02 mA/sr or more at a rate of change of 5% or less. Further, they disclose that the above-mentioned TFE is obtainable by combining a dry-etching method with the conventional electropolishing method.

However, the method disclosed in the publication involves a problem that an electron emitter having a desired shape of the top end, in particular a shape of the top end wherein the radius of curvature is 0.6 $\mu$m or more and the half cone angle is 10° or less can not be obtained at a reduced cost since the method utilizes processes of low productivity such as electric discharging and dry etching, and further, an expensive device for inclusive use is needed.

A focused ion beam (FIB) source is used for various types of semiconductor inspection apparatus and semiconductor processing apparatus, and it attracts users attention in recent years. In particular, a liquid metal ion source wherein gallium is used as ion species is widely known as an ion source for FIB.

The liquid metal ion source is so adapted that a needle electrode made of metal having a high melting point is gotten wet with liquid metal, and a high electric field strength is applied to a sharp edge of the needle electrode to ionize the liquid metal. A cone-like protection of liquid metal which is called Tailor cone is formed at the sharp edge of the needle electrode by the effect of the high electric field strength, and ions are emitted from the sharp edge. The cone angle of the Tailor cone is supposed to be about 97° in full angle, and it is known to be important to form the cone angle at the sharp edge of the needle electrode in conformity with the cone angle of Tailor cone.

Accordingly, the sharp edge is generally formed by an electropolishing method in the same manner as in the needle electrode for the electron emitter. Besides use of the electropolishing method, a technique of mechanically polishing can be used. However, such mechanically polishing method requires a special jig because it is used for a fine part, with the result that manufacturing cost becomes high. Further, the electropolishing method can not easily provide a needle electrode having a cone angle which is close to the cone angle of Tailor cone in stable manner.

The electropolishing method for the needle electrode is disclosed in, for example, "Kotai Butsuri", vol. 2, No. 2 (1966) 33–38. However, the conventional method has a problem that the cone angle and the radius of curvature of the top end portion can not independently be controlled because they are in a strong correlation, in particular, when the radius of the top end is large, it is difficult to reduce the half cone angle.

SUMMARY OF THE INVENTION

The present invention has been made in consideration of the above-mentioned problems. The inventors have had many experimental studies to obtain a needle electrode having a desired shape of top end in stable and economical manner when a neck portion is previously formed in a thin wire made of metal having a high melting point by using an electropolishing method and then, the neck portion is cut. They have further found that the needle electrodes are suitable for both an electron emitter and an ion source. Thus, the present invention has been achieved.

It is an object of the present invention to provide a needle electrode having a desired shape of top end in stable and economical manner, with the result that an electron emitter used for an electron microscope, a CD SEM, an electron beam lithography system, an IC tester or the like and an ion source used for a focused ion beam (FIB) source for a mask repair, an ion implantation device, a device for analyzing a cross-section of a semiconductor device, a specimen preparation apparatus for a transmission electron beam or the like can be provided in economical and stable manner.

It is further object of the present invention to provide a TFE having a desired shape of top end wherein the radius of curvature is large, preferably 1.5 μm or more and the half cone angle is smaller, preferably 10° or less, with the result that the width of energy is small; the angular current density is high and the electron beam characteristics are provided stably for a long term.

In accordance with the present invention, there is provided a method of making a needle electrode characterized in that a neck portion is formed in a thin wire made of metal having a high melting point and the thin wire is cut at the neck portion. Preferably, the neck portion is formed by an electropolishing method.

In the present invention, the neck portion is formed by electropolishing at an initial speed in a range of from 0.01 μm/sec or more to 0.1 μm/sec, or the neck portion is melt-cut by applying heat.

In the above-mentioned invention, particularly, the neck portion is melt-cut by feeding an electric current to the thin wire to generate Joule heat. Preferably, an end of the thin wire is dipped in liquid metal, and an electric current is fed to the thin wire through the liquid metal. More preferably, the liquid metal is Ga.

In the above-mentioned invention, sodium hydroxide aqueous solution and/or potassium hydroxide aqueous solution is used as electrolyte at a concentration of from 0.1N to 0.8N, and a direct current is supplied for electropolishing to cut the neck portion. Preferably, a reduction rate of the electric current in the electrolyte is measured, and when the reduction rate reaches a predetermined value, the electropolishing is stopped. More preferably, the predetermined value is determined to be 10% or more.

In the above-mentioned invention, the thin wire having a high melting point is formed of at least one selected from the group consisting of tungsten, molybdenum, tantalum and rhenium. Preferably, the thin wire having a high melting point is formed of a tungsten or molybdenum single crystal.

Further, in accordance with the present invention, there is provided a needle electrode for an electron emitter characterized in that the needle electrode obtained by the above-mentioned method is subjected to a heat treatment in vacuum whereby the radius of curvature of the top end of the needle electrode is adjusted, or the needle electrode obtained by the above-mentioned method is heated under a reduced pressure while introducing oxygen and/or water to effect etching in an gaseous phase whereby the radius of curvature of the top end of the needle electrode is adjusted.

BRIEF DESCRIPTION OF THE DRAWINGS

A more complete appreciation of the invention and many of the attendant advantages thereof will be readily obtained as the same becomes better understood by reference to the following detailed description when considered in conjunction with the accompanying drawings, wherein.

DESCRIPTION OF THE PREFERRED EMBODIMENTS

Figure 1:
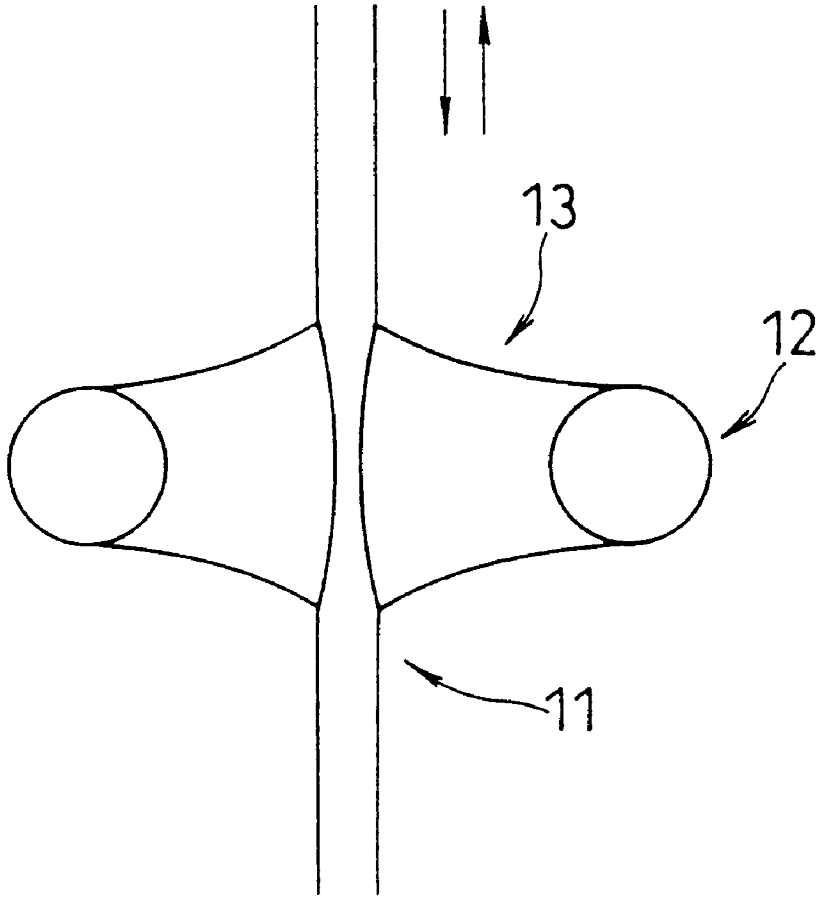
FIG. 1 is a diagram for explaining an electropolishing method for forming a neck portion in a thin wire.

With reference to the present drawings, it is noted that like reference numerals designate identical or corresponding parts throughout the several views.

In the following, several methods of making a needle electrode of the present invention will be described by taking an example of an electron emitter. First, a conventional method of making an electron emitter comprises (Process 1) to (Process 5) described as follows.

(Process 1) A tungsten filament having a V-like shape is attached by spot welding to top ends of two metallic poles brazed to an insulator. Further, to the top portion of the V-like shape tungsten filament, a thin wire of tungsten single crystal having a length of 3.0 mm, a diameter of about 0.13 mm and a direction of <100> is attached by spot welding.

(Process 2) A ringed electrode is put in NaOH aqueous solution, and an end portion of the thin wire of tungsten single crystal is dipped in the aqueous solution to effect electropolishing whereby the thin wire is polished so that a part of the thin wire is cut off to obtain a needle electrode with a sharp end.

(Process 3) A slurry obtained by grinding zirconium hydride in an organic solvent is coated on the thin wire of tungsten single crystal at a position about 0.2 mm apart from the top portion of the filament.

(Process 4) The thin wire of tungsten single crystal is put in an ultra-vacuum device in which air is evacuated to $3\times10^{-9}$ Torr. A current is supplied to the tungsten filament through the metallic poles so that the thin wire of tungsten single crystal is heated to about 1,800 K. Then, oxygen is introduced to be at $3\times10^{-6}$ Torr, and the pressure condition is maintained for 48 hrs. As a result, the zirconium hydride is thermally decomposed and oxidized whereby a reservoir of zirconium oxide is formed.

Figure 2:
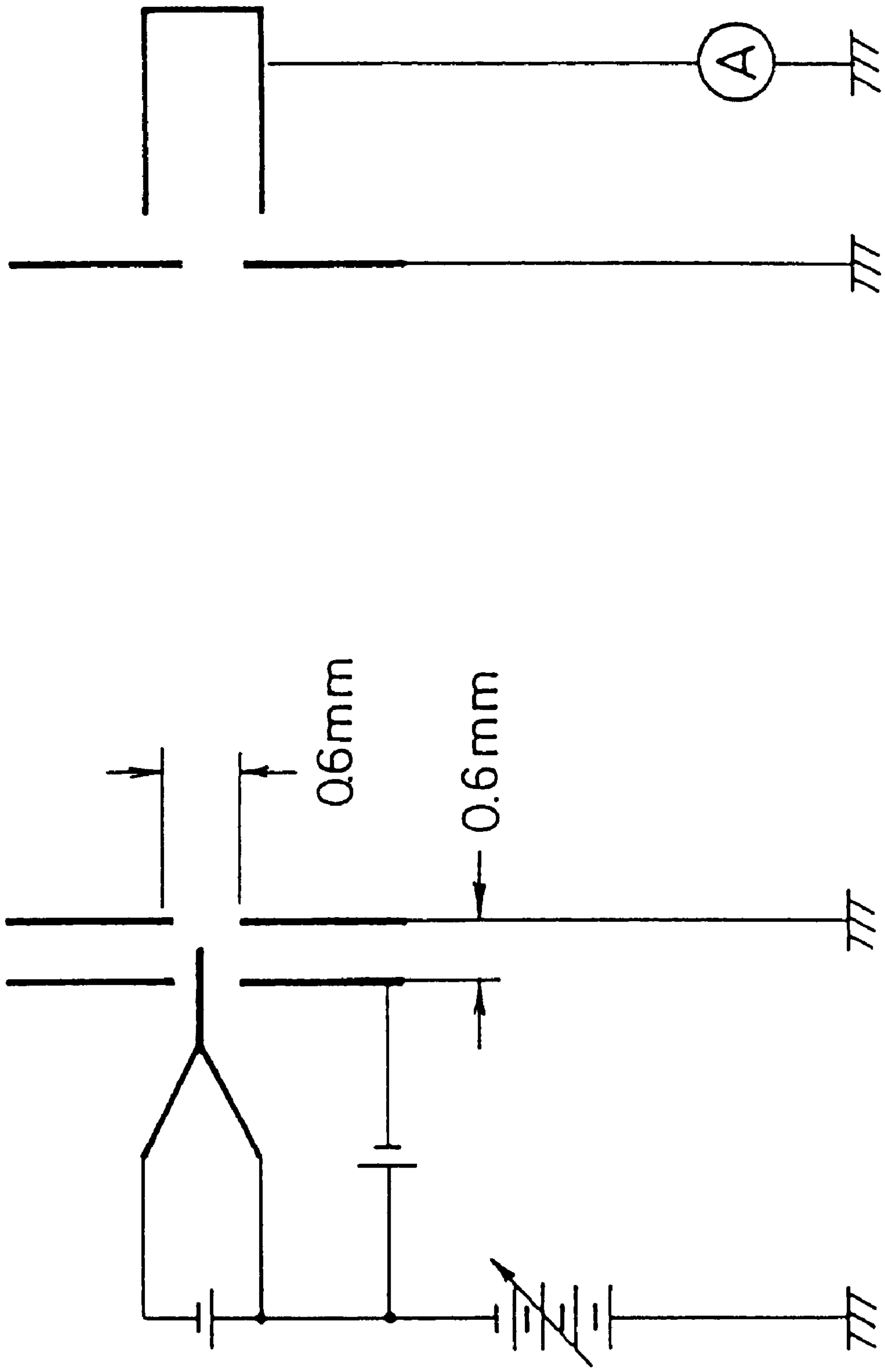
FIG. 2 is a circuit diagram for measuring the electron emission characteristics of thermal field emitters used for Examples of the present invention and Comparative Examples.

(Process 5) The insulator is capped with a suppressor electrode so that the needle electrode projects from an opening formed in the suppressor electrode, followed by mounting it on an electron gun having paired extraction electrodes. Then, the electron gun is put in the ultra-vacuum device. Then, the vacuum device is evacuated to $5\times10^{-10}$ Torr, and an electric current is supplied to the tungsten filament so that the needle electrode is heated to 1,800 K. Then, emission of electrons is caused on the needle electrode by applying a high voltage of a negative polarity (a extraction voltage) with respect to the extraction electrodes. An axial current passing the extraction electrodes is monitored, and the electron emission is maintained until the current becomes stable. FIG. 2 shows systems capable of applying a high voltage and measuring the electric current. Further, an axial angular current density $I'p=Ip/\omega$ is calculated on the basis of an axial current Ip and a solid angle w measured with the systems.

On the other hand, in the method of the present invention, (Process 2) of the conventional technique is replaced by (Process A) and (Process B) or (Process B), or (Process 2) is omitted and instead of that, (Process A) and (Process C) are inserted between (Process 4) and (Process 5) in order to preferably control the shape of the top end of the needle electrode. Further, in the present invention, (Process D) may be used as an additional process.

(Process A) A ringed electrode 12 is put in NaOH aqueous solution 13, and a thin wire of tungsten single crystal 11 is dipped in the aqueous solution. Electropolishing is effected to the thin wire of tungsten by moving vertically the thin wire to thereby form a neck portion at a part of the thin wire of tungsten single crystal (FIG. 1). The neck portion referred to in this text means a portion which satisfies the relation of $D2<D1$ wherein a portion of diameter D2 is formed in a part of the thin wire having a diameter D1. In particular, it is preferable to satisfy a relation of $D2\leqq 0.8D1$ because a needle electrode having a smaller half cone angle is easily obtainable.

After having subjected to (Process A), part of the thin wire of tungsten single crystal is cut off by passing the thin wire through (Process B) or (Process C) in which electropolishing is effected under specified conditions according to the present invention. Thus, a needle electrode is formed.

(Process B) In the same manner as in (Process A), the ringed electrode is put in NaOH aqueous solution, and the thin wire of tungsten single crystal is dipped in the aqueous solution followed by electropolishing the thin wire while it is moved vertically, and finally, the thin wire is cut off. In this case, it is preferable that an initial speed for electropolishing is from 0.01 $\mu$m/sec to 0.1 $\mu$m/sec. When the initial speed is less than 0.01 $\mu$m/sec, a defect of crystal appears in the surface of the needle electrode obtained by electropolishing, which reduces the electron emission characteristics. On the other hand, when the initial speed exceeds 0.1 $\mu$m/sec, it is difficult to control the electropolishing. A speed for electropolishing (a polishing speed) is obtained by dividing a change of the diameter of the thin wire in a predetermined time from the start of electropolishing to the finish, by the predetermined time for the electropolishing. The diameter of the thin wire is measured with a projector of 50 magnifications, for example.

In the above-mentioned (Process A) and (Process B), it is preferable to effect electropolishing by supplying a direct current in sodium hydroxide aqueous solution and/or potassium hydroxide aqueous solution, as electrolyte, which are prepared to be 0.1N–0.8N. When it is less than 0.1N, a defect of crystal appears in the surface of the needle electrode obtained by electropolishing to thereby reduce the electron emission characteristics. On the other hand, when it exceeds 0.8N, controllability of polishing is reduced. It is further desirable to measure a reduction rate of an electrolytic current during electropolishing and to stop the electropolishing when the reduction rate becomes a predetermined value or higher (because a needle electrode having a desired shape of top end can be obtained with good reproducibility). It is in particular preferable that the electropolishing is stopped when the reduction rate becomes 10% or more. If the electropolishing is not forced to stop, the electropolishing will progress whereby a needle electrode having desired radius of curvature of the top end and desired half cone angle can not be obtained. Further, (Process A) and (Process B) may be separately conducted as separate processes, or they may be conducted in a series of operation as a single process. The rate of change of the electrolytic current can be measured with use of, for instance, a digital ammeter wherein an average value obtained among 1000 sampled values in an integrated time of 2.5 ms at sampling intervals of 20 ms is used, and an average of the movement of electric current in two seconds can be measured.

Further, in the method of the present invention, the above-mentioned (Process B) may be replaced by (Process C) which will be described hereinbelow.

(Process C) This process is to form a needle electrode having substantially the same radius of curvature at the top end as the radius of the neck portion formed by (Process A) by heating and melt-cutting the neck portion formed in (Process A). For example, the top end of the thin wire of tungsten single crystal is dipped in liquid metal received in a metallic boat in a vacuum device. Then, a pressure inside the vacuum device is reduced to $5\times10^{-7}$ Torr, and an electric current is supplied to the tungsten filament through the metallic poles so that temperature at and around the neck portion of the thin wire of tungsten single crystal is elevated to 1,800 K and the elevated temperature is maintained. Further, an electric current is fed to the thin wire of tungsten single crystal through the liquid metal by means of a power supply for feeding current to the thin wire so that only the neck portion is locally heated and melt-cut. As the liquid metal, such once that assumes a liquid phase at a low temperature and has a lower vapor pressure under a vacuum condition is preferably used. For example, Ga, Hg, solder or the like may be used. In particular, Ga is preferably used because it assumes a liquid phase in the room temperature and it is poor in reaction with various kinds of materials, hence, it is easy in handling.

The above-mentioned (Process C) exemplifies a case that an electric current is supplied to a thin wire of tungsten single crystal having a neck portion to thereby heat locally the neck portion whereby the thin wire is melt-cut at the neck portion. However, the neck portion can be melt-cut by locally heating it by using a LASER, an electron beam, an infrared ray or the like. Alternately, the thin wire of tungsten single crystal having the neck portion is fixed to a filament having a high melting point, and a current is fed to the filament to heat a part of or the entire part including the neck portion of the thin wire whereby the thin wire is melt-cut at the neck portion. The inventors of this application have found that a preferable result is obtained when (Process 4) is conducted prior to (Process A) or (Process C) in a case that (Process C) of the present invention is to be employed. When (Process 4) is conducted after (Process C), a gaseous phase etching phenomenon appears in (Process 4) whereby the shape of the top end becomes a pyramidal form.

In the method of the present invention, a neck portion having a predetermined dimension can be formed in (Process A), and then, (Process B) or (Process C) is conducted to cut a thin wire at the neck portion. Accordingly, this method is featurized by forming a needle electrode having substantially the same radius of curvature at the top end as the radius of the neck portion formed in (Process A) with good reproducibility. Further, in the method of the present invention, the shape of the top end of the needle electrode is almost determined in (Process A). However, since an electropolishing method is used in (Process A) and (Process B) and a heat-melting method is used in (Process C), the method of the present invention is applicable to any thin wire irrespective that it is of a single crystal or polycrystal.

As the thin wire of metal having a high melting point used for the present invention, metal having resistance to heat under vacuum condition and a high melting point such as tungsten, molybdenum, tantalum, rhenium or the like is preferable from the viewpoint of limitation of usage. In particular, a thin wire made of at least one selected from the group consisting of tungsten, molybdenum, tantalum and rhenium and having a diameter of about 0.1–0.5 mm is preferable.

Although the method of the present invention fundamentally includes (Process A) and (Process B), or (Process B), or (Process A) and (Process C), it is possible to incorporate (Process D) by which the shape of the top end of the needle electrode can be controlled finely.

(Process D) This process is to control more precisely the shape of the top end of the needle electrode obtained by the above-mentioned processes. In studies by the inventors, the radius of curvature of the top end of the needle electrode obtained by the above-mentioned processes can be increased by a heat treatment to it in a vacuum condition. Further, the radius of curvature of the top end of the needle electrode can be reduced by heating the needle electrode under a reduced pressure while oxygen and/or water is introduced. By suitably selecting the above-mentioned two methods, the shape of the top end of the needle electrode obtained by the method can be controlled more precisely.

Now, the present invention will be described in detail with reference to Examples. However, it should be understood that the present invention is by no means restricted to such specific Examples.

EXAMPLES 1 THROUGH 3 AND COMPARATIVE EXAMPLES 1 THROUGH 3

In Examples 1 through 3, thermal field emitters each having a needle electrode with different radius of curvature were prepared by using (Process 1), (Process 3), (Process 4), (Process A), (Process C) and (Process 5) in this order wherein conditions for electropolishing in (Process A) were adjusted.

In Comparative Examples 1 through 3, thermal field emitters each having a needle electrode with different radius of curvature were prepared by using conventionally known (Process 1), (Process 2), (Process 3), (Process 4) and (Process 5) in this order wherein conditions for electropolishing in (Process 2) were adjusted.

Table 1 shows the shape of the top end and the electron emission characteristics of each of the thermal field emitters.

TABLE 1

| | Radius of curvature (μm) | Half cone angle (deg) | Extraction voltage (kV) | Angular current density (μA/sr) | Stabilizing time (hr) |
|---|---|---|---|---|---|
| Example 1 | 2.9 | 4.2 | 2.50 | 85 | 32 |
| Example 2 | 4.2 | 3.8 | 2.50 | 82 | 28 |
| Example 3 | 26.0 | 2.5 | 2.50 | 310 | 35 |
| Comparative Example 1 | 0.43 | 7.7 | 3.08 | 303 | 15 |
| Comparative Example 2 | 0.68 | 10.4 | 3.89 | 310 | 63 |

TABLE 1-continued

| | Radius of curvature (μm) | Half cone angle (deg) | Extraction voltage (kV) | Angular current density (μA/sr) | Stabilizing time (hr) |
|---|---|---|---|---|---|
| Comparative Example 3 | 1.1 | 14.8 | 4.90 | 540 | 120 |

Table 1 clearly shows that the radius of curvature in each of the needle electrodes according to the method of the present invention are easily controllable within a range of 2.0–100 μm, in particular, within a range of 2.0–20 μm while the half cone angle is suppressed to be 10° or less.

EXAMPLES 4 THROUGH 7 AND COMPARATIVE EXAMPLE 4

In Examples 4 through 7, thermal field emitters were prepared by using (Process 1), (Process A), (Process B), (Process 3), (Process 4) and (Process 5) in this order wherein (Process A) and (Process B) were conducted as a series of operation. Further, in Examples 4 through 7, sodium hydroxide aqueous solution of 0.25N, 0.5N, 0.7N and 1.0N were respectively used as electrolyte in (Process A), hence, (Process B). For electropolishing, a direct current is supplied wherein thin wires of tungsten single crystal were used as an anode respectively. The thin wires were vertically moved at a stroke of about 150 μm while a voltage of 6V was applied to the thin wires. An electrolytic current was measured, and the electropolishing was finished upon confirmation that a reduction rate of the electrolytic current was 10% or more.

The shape of the top end and the electron emission characteristics of each of the thermal field emitters were examined, and a rate of change of the radius of curvature of the top end after electron emission for 5,000 hours was examined. Further, as an Comparative Example, a thermal field emitter obtained by using the same processes as in Comparative Examples 1 through 3 was examined. A result of examination is described in Table 2.

TABLE 2

| | Half cone angle (deg) | Extraction voltage (kV) | Initial angular current density (μA/sr) | Initial radius of top end (μm) | Radius of top end after 5,000 hrs (μm) | Rate of change of top end radius of curvature |
|---|---|---|---|---|---|---|
| Example 4 | 2.0 | 1.62 | 176 | 0.27 | 0.48 | 1.8 |
| Example 5 | 2.5 | 1.77 | 118 | 0.40 | 0.68 | 1.7 |
| Example 6 | 4.0 | 2.01 | 116 | 0.53 | 0.75 | 1.4 |
| Example 7 | 8.0 | 5.02 | 520 | 1.70 | 1.70 | 1.0 |
| Comparative Example 4 | 12.0 | 3.28 | 123 | 0.53 | 1.15 | 2.2 |

Table 2 shows that a change of the radius of curvature of each of the electron emitters obtained by the method of the present invention is smaller than that of the electron emitters prepared by the conventional method even in a case that the electron emitters of the present invention have been operated for a long term as 5,000 hours.

Figure 3:
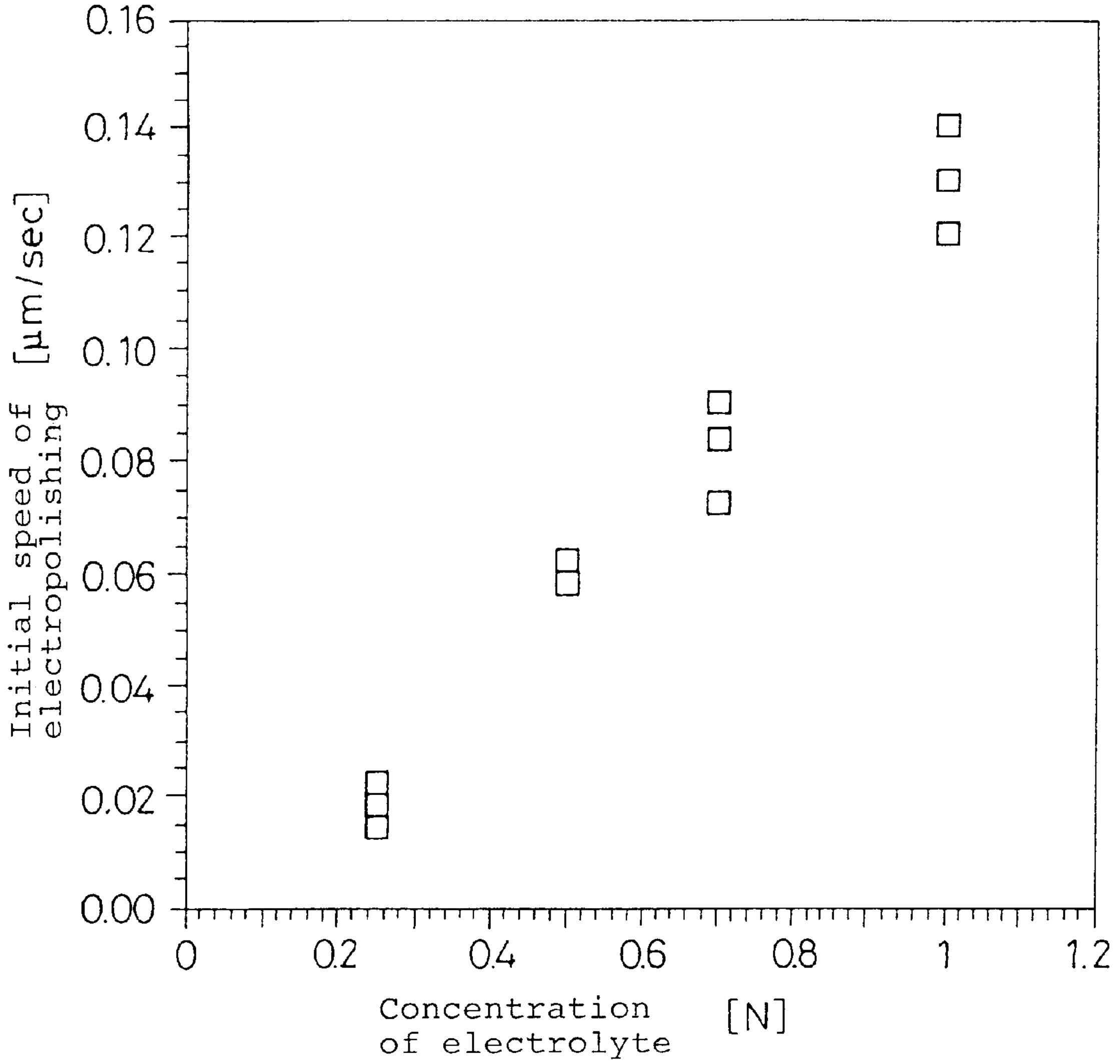
FIG. 3 is a diagram showing a relation of a concentration of electrolyte and an initial polishing speed in the present invention.
Figure 4:
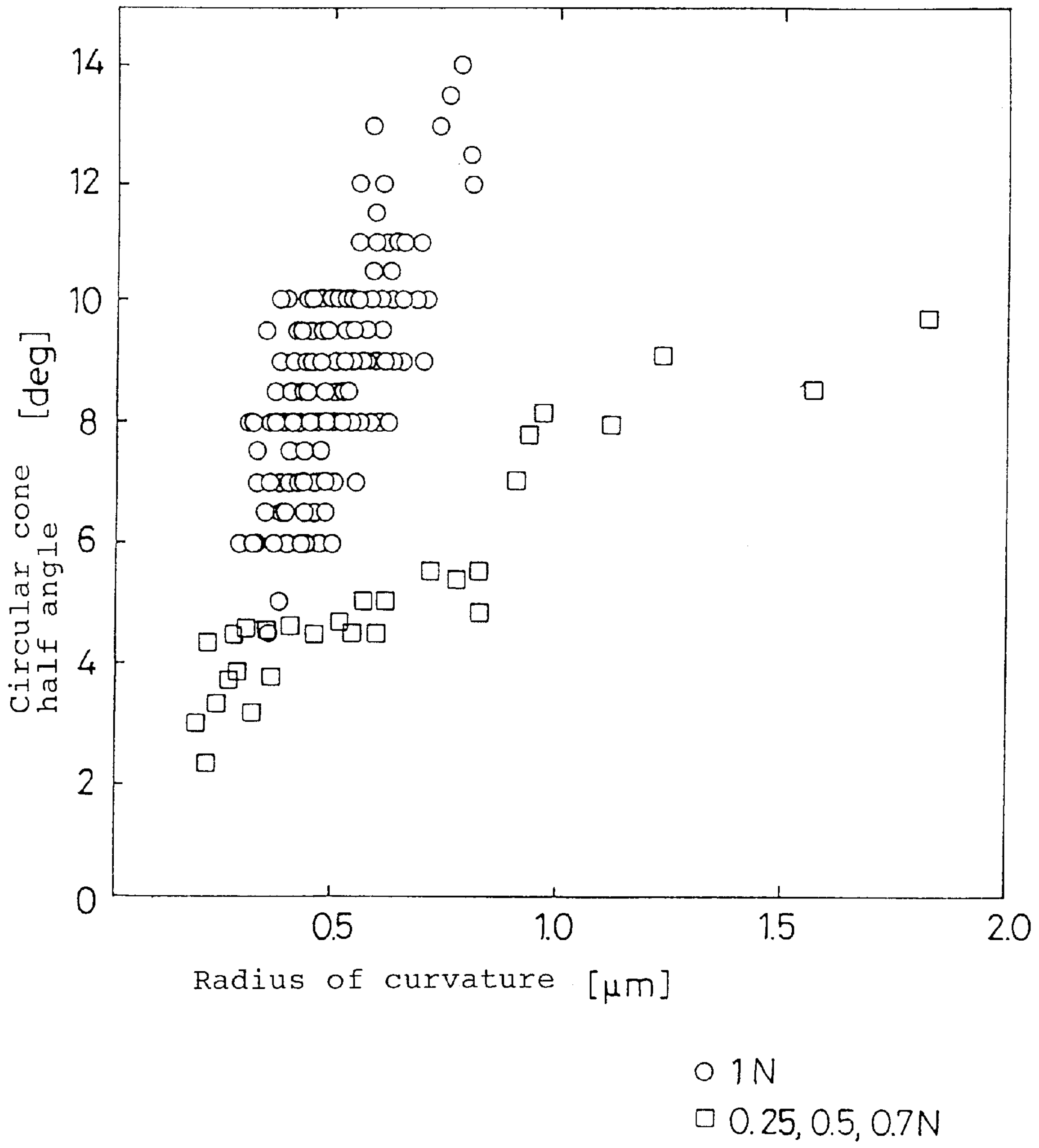
FIG. 4 is a diagram showing a relation of a radius of curvature and a half cone angle of the needle electrode formed according to the present invention.

A relation of a concentration of electrolyte and an initial polishing speed was examined from the results of Examples 4 through 7 and experimental data concerning the present invention which are not described herein, which is shown in FIG. 3. Similarly, FIG. 4 shows a relation of a radius of curvature and a half cone angle of needle electrodes obtained by the method of the present invention. The diagram of FIG. 4 shows that a needle electrode having a smaller half cone angle and a larger radius of curvature is obtainable. In particular, when the concentration of electrolyte is 0.1–0.8N, the initial polishing speed is controlled to be 0.01–0.1 μm/sec, and a needle electrode having a radius of curvature of 2.0 μm or less while the half cone angle is kept at 10° C. or less can be obtained.

In accordance with the present invention, a needle electrode having a shape of top end in which the radius of curvature is 0.6 μm or more and the half cone angle is 10° C. or less, which has been difficult to obtain, can be provided without using a special device. Accordingly, it is possible to provide a thermal field emitter having a small energy width and being usable with stable electron emission characteristics for a long term, and is useful for industries.

Since the method of the present invention can form the shape of the top end of a needle electrode by means of electropolishing and melt-cutting which are unlikely to cause crystal anisotropy, the method is applicable to a needle electrode for an ion source which is formed of a thin wire of polycrystal.

Obviously, numerous modifications and variations of the present invention are possible in light of the above teachings. It is therefore to be understood that within the scope of the appended claims, the invention may be practiced otherwise than as specifically described herein.

What is claimed is:

1. A method of making a needle electrode having a tip, comprising:

providing a straight thin piece of metal wire made of at least one metal selected from the group consisting of tungsten, molybdenum, tantalum, and rhenium;

forming a neck portion in said straight thin piece of said metal wire; and cutting the straight thin piece of said metal wire at the neck portion so as to provide said tip with a half cone angle of 10° or less.

2. The method of making a needle electrode according to claim 1, wherein the step of forming the neck portion includes electropolishing.

3. The method of making a needle electrode according to claim 2, wherein the electropolishing step is performed at an initial speed in the range of from 0.01 μm/sec to 0.1 μm/sec.

4. The method of making a needle electrode according to claim 2, further comprising using sodium hydroxide aqueous solution and/or potassium hydroxide aqueous solution as an electrolyte at a concentration from 0.1N to 0.8N and said cutting step further includes supplying a direct current for electropolishing to cut the neck portion.

5. The method of making a needle electrode according to claim 4, further comprising measuring a reduction rate of the direct current in the electrolyte and stopping the electropolishing when the reduction rate reaches a predetermined value.

6. The method of making a needle electrode according to claim 5, wherein the predetermined value is 10% or more.

7. The method of making a needle electrode according to claim 1, wherein the step of cutting the neck portion includes melt cutting by applying heat.

8. The method of making a needle electrode according to claim 7, wherein the melt cutting step includes feeding an electric current to the straight thin piece of said metal wire to generate Joule heat.

9. The method of making a needle electrode according to claim 8, further including the step of dipping an end of the straight thin piece of said metal wire in liquid metal and feeding an electric current to the straight thin piece of said metal wire through the liquid metal.

10. The method of making a needle electrode according to claim 9, wherein the liquid metal is Ga.

11. The method of making a needle electrode according to claim 1, wherein the thin wire is formed of a tungsten or molybdenum single crystal.

* * * * *